ны
United States Patent
Chen et al.

(12) United States Patent
(10) Patent No.: US 6,756,823 B1
(45) Date of Patent: Jun. 29, 2004

(54) DIFFERENTIAL SENSE LATCH SCHEME

(75) Inventors: Feng Chen, Portland, OR (US); Tom Fletcher, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/606,367

(22) Filed: Jun. 28, 2000

(51) Int. Cl.[7] .................................................. H03F 3/45
(52) U.S. Cl. ............................ 327/52; 327/55; 327/57
(58) Field of Search ............................... 327/51, 52, 55, 327/57, 266; 326/96, 97, 98; 330/253, 307; 365/207, 208, 189, 205

(56) References Cited

U.S. PATENT DOCUMENTS

| 5,903,171 | A | * | 5/1999 | Shieh ........................ 327/55 |
| 5,982,689 | A | * | 11/1999 | Takahashi ................. 365/205 |
| 6,037,824 | A | * | 3/2000 | Takahashi ................. 327/337 |
| 6,160,742 | A | * | 12/2000 | Chung et al. ............ 365/189.5 |
| 6,163,501 | A | * | 12/2000 | Ohshima et al. ......... 365/233 |
| 6,239,624 | B1 | * | 5/2001 | Yang et al. ................. 327/55 |

* cited by examiner

Primary Examiner—My-Trang Nu Ton
Assistant Examiner—Hiep Nguyen
(74) Attorney, Agent, or Firm—Schwegman, Lundberg, Woessner & Kluth, P.A.

(57) ABSTRACT

A circuit including a differential sense circuit and a latch, the differential sense circuit and the latch coupled so as to form a differential sense latch such that, in operation, an electronic signal stored in the latch is retained for at least one clock cycle.

2 Claims, 5 Drawing Sheets

DIFFERENTIAL SENSE LATCH SCHEME

BACKGROUND

1. Field

This disclosure relates to latches, and, more particularly, to differential sense latches.

2. Background Information

Two typical competing concerns in circuit design are performance versus power consumption and performance versus silicon area. Typically, improving the performance of a circuit, such as one embodied on an integrated circuit (IC), for example, results, at least, in corresponding increases in power consumption and/or silicon area, for example, both of which may be undesirable. For example, with such circuits, electronic system and IC packaging costs may increase due to measures that are employed to dissipate the heat generated by such increases in power consumption. Also, for example, increases in power consumption may present additional circuit design concerns, such as IC reliability and circuit immunity to electronic noise. Current methods employed to achieve such performance improvements may also result in increases to silicon area of such an IC, which is typically directly related to increases in power consumption.

In this regard, dynamic and differential circuitry may be subject to at least some of the foregoing concerns, though additional concerns may exist. These types of circuits are, for example, typically employed in high-speed circuitry. In this context, high-speed circuitry is circuitry that is capable of processing electronic signals at a relatively fast rate as compared to other types of circuitry, such as static logic, for example. The term high-speed, in this context, is well-known to those of skill in the art.

In certain situations, for such circuit embodiments, it may be desirable to retain, for some specific time duration, an electronic signal, or signals produced by such differential and/or dynamic circuitry. Similar concerns regarding methods for improving the performance or speed of ICs employing such dynamic and differential circuitry may also be relevant to such associated circuitry for retaining such signal(s). In this respect, such methods may actually result in adverse impacts on performance, such as "speed", for example, due, at least in part, to the capacitive loading typically associated with circuits employed in implementing such techniques. Therefore, alternatives for achieving such performance improvements may be desirable.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As was previously indicated, dynamic and/or differential circuitry may be employed in circuits, such as those embodied on an integrated circuit, to achieve, for example, improvements in performance of such circuits. As was also indicated above, in certain situations, it may be desirable to retain an electronic signal value produced by such differential or dynamic circuitry for a certain period of time. Though it may depend on the specific embodiment, this time may be substantially equal to one clock period for a circuit in which such a scheme is employed, though, of course, alternatives may exist. Typically, as those of skill in the art would be aware, such electronic signal values are typically produced by such differential and/or dynamic circuitry as a result of an evaluate operation. Evaluate operations will be discussed in further detail hereinafter. However, at a high level, as those of skill in the art would be aware, such a technique typically comprises pre-charging such circuitry, applying input signals to such circuitry and then applying an electronic signal, which causes such circuitry to "evaluate" the input signals and produce a corresponding output signal. In such a circuit, once such an evaluate operation is complete the circuit typically is returned to pre-charge mode to facilitate execution of a subsequent evaluate operation. Typically, this sequence occurs in less than one clock cycle. In this scenario, the results of the prior evaluate would typically no longer be available.

Depending on the particular embodiment, the above scenario may be undesirable. For example, if such differential and/or dynamic circuitry were employed to interface with static logic, such as traditional complementary metal-oxide silicon (CMOS) logic gates, it may be desirable to retain the result from such an evaluate until that result is replaced with a result from a subsequent evaluate operation. In this regard, FIG. 1 illustrates two current techniques for retaining such results.

Figure 1:
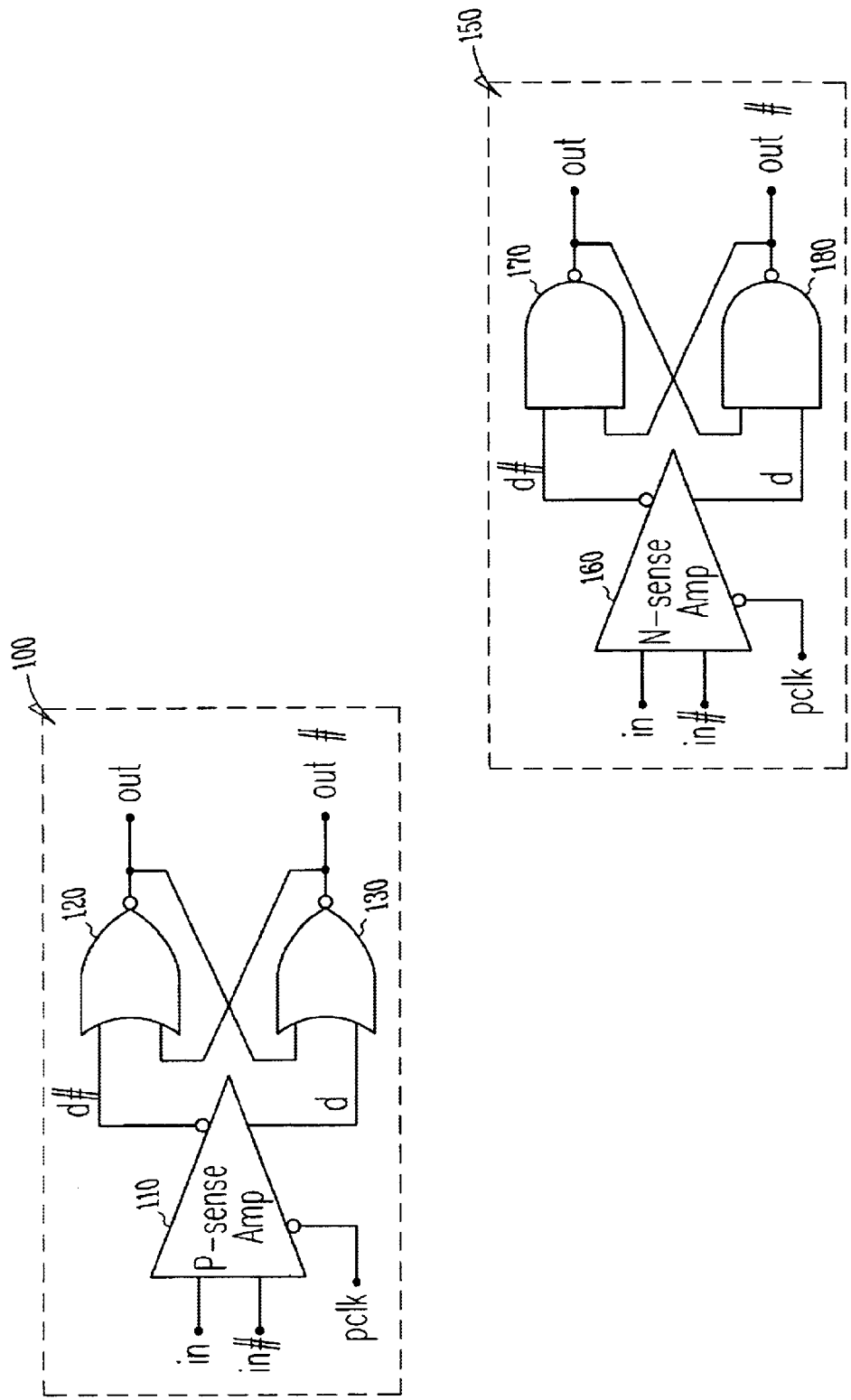
FIG. 1 is a schematic diagram illustrating two current differential latch embodiments.

FIG. 1 illustrates two embodiments of current latches that may be employed with certain types of differential or dynamic circuitry to retain such evaluation results. In this respect, the circuit in block 100 may be employed with differential and/or dynamic circuits that are designed to pre-charge their differential output terminals to a voltage that is substantially equal to ground or "pulled low", such as p-sense amp 110. Such sense amps will be discussed in further detail hereafter.

For the embodiment illustrated in block 100, the output terminals of a p-sense amplifier (amp), 110, are each coupled to one input terminal of each of the cross-coupled NOR gates 120 and 130. These cross-coupled NOR gates form a differential latch. In this regard, during pre-charge, such a latch would retain a result stored by a previous evaluate operation. The latch would retain such a result during pre-charge due, at least in part, to the aspect that the output terminals of the amp are pulled low during pre-charge. Because of the cross-coupled configuration of the NOR gates, pulling a single input terminal low on each gate will not result in modification of the contents of such a latch. During an evaluation of p-sense amp 110, one of the two differential outputs would be pulled high while the other will remain low. This may, depending on the contents of the latch, result in the modification of the contents of the latch. In this regard, if an evaluate operation pulls the inverted output terminal, designated "d#", of p-sense amp 110 high and then a subsequent evaluate pulls the non-inverted output terminal, designated "d", high, this sequence would result in the latch contents being modified.

FIG. 1 also illustrates, in block 150, another embodiment of a current latch that may be employed with differential and/or dynamic circuitry. Here, the differential latch comprises cross-coupled NAND gates 170 and 180. Such a latch may be employed with differential and/or dynamic circuitry that is designed to have output terminals which are pre-charged to a voltage substantially equal to a power supply voltage for such a circuit, or "pulled high", such as n-sense amp 120. As was the case with the circuit illustrated in block 100, a result stored in such a latch would be retained during a pre-charge operation as pulling only a single input terminal of each NAND gate high would not result in the contents of such a latch being modified.

Figure 2:
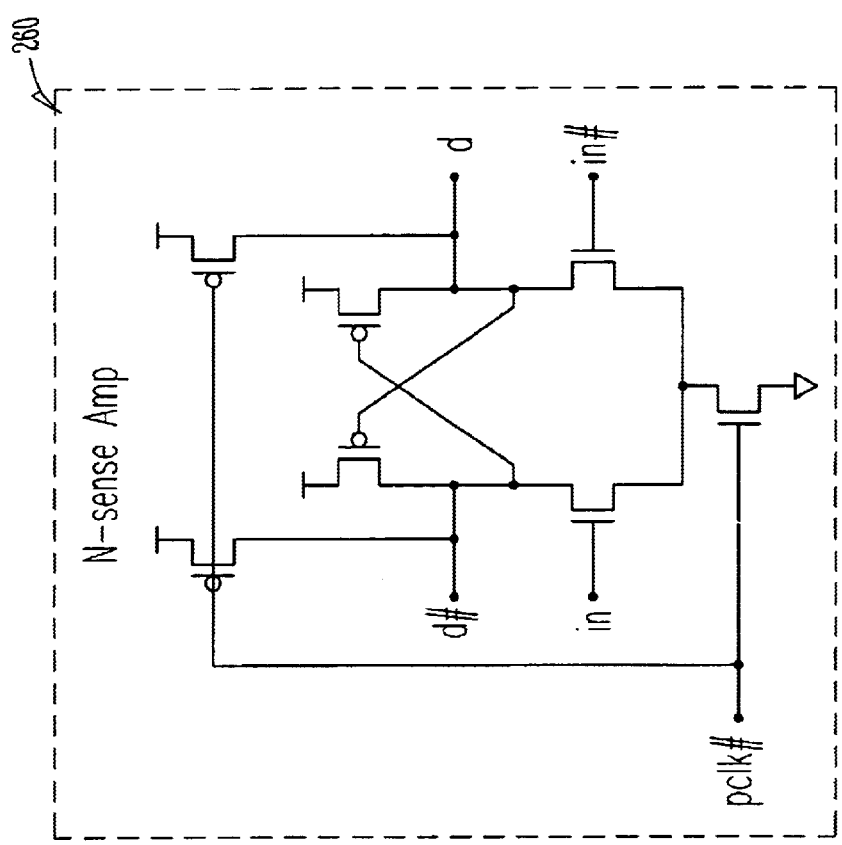
FIG. 2 is a schematic diagram illustrating embodiments of P-type and N-type differential sense amplifiers.
Figure 2:
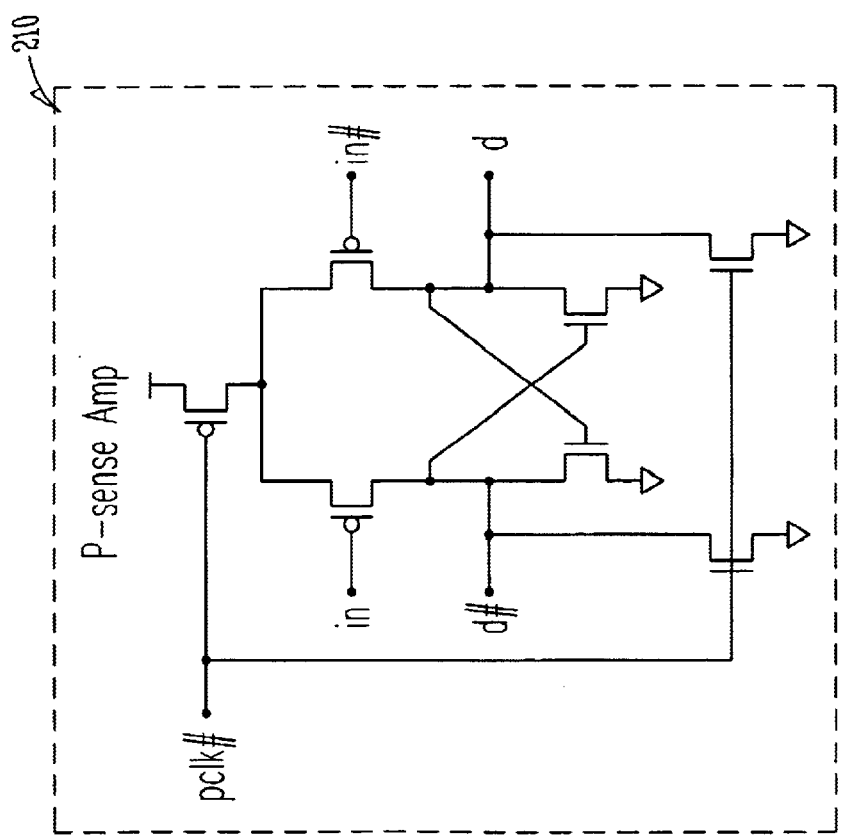

FIG. 2 illustrates an embodiment of a p-sense amp, 210, and an embodiment of an n-sense amp, 260. These sense amps may be employed by the configurations illustrated in FIG. 1. In this regard, for p-sense amp 210, pre-charge would occur when a clock signal asserted on the terminal designated "pclk#" is pulled high. For n-sense amp 260, pre-charge would occur when a clock signal asserted on its pclk terminal is pulled low. Likewise, "evaluate" would occur when such a clock signal is pulled low for p-sense amp 210 and pulled high for n-sense amp 260. In certain embodiments employing a global clock signal, it may be desirable to invert the clock input signal for p-sense amps, as is discussed in more detail hereafter. This may be advantageous in, for example, synchronous circuits, as pre-charge and evaluate for n-sense amps and p-sense amps in such an embodiment may occur substantially simultaneously.

While the foregoing technique addresses the concern of retaining an evaluation result from differential and/or dynamic circuitry for a time substantially equivalent to one clock cycle, such embodiments also have certain disadvantages. For example, because of the cross-coupled configuration of the latches employed in these embodiments, two full CMOS gate delays would be added to a signal path in which such a latch is employed. These gate delays may, therefore, adversely affect the performance of such a signal path. One way the concern with gate delay may be addressed is to decrease such gate delays by increasing transistor sizes in such gates. This technique, however, may result in increased power consumption and increased silicon area for such circuits, which are embodied on an integrated circuit (IC), for example. This result may also be undesirable.

Figure 3:
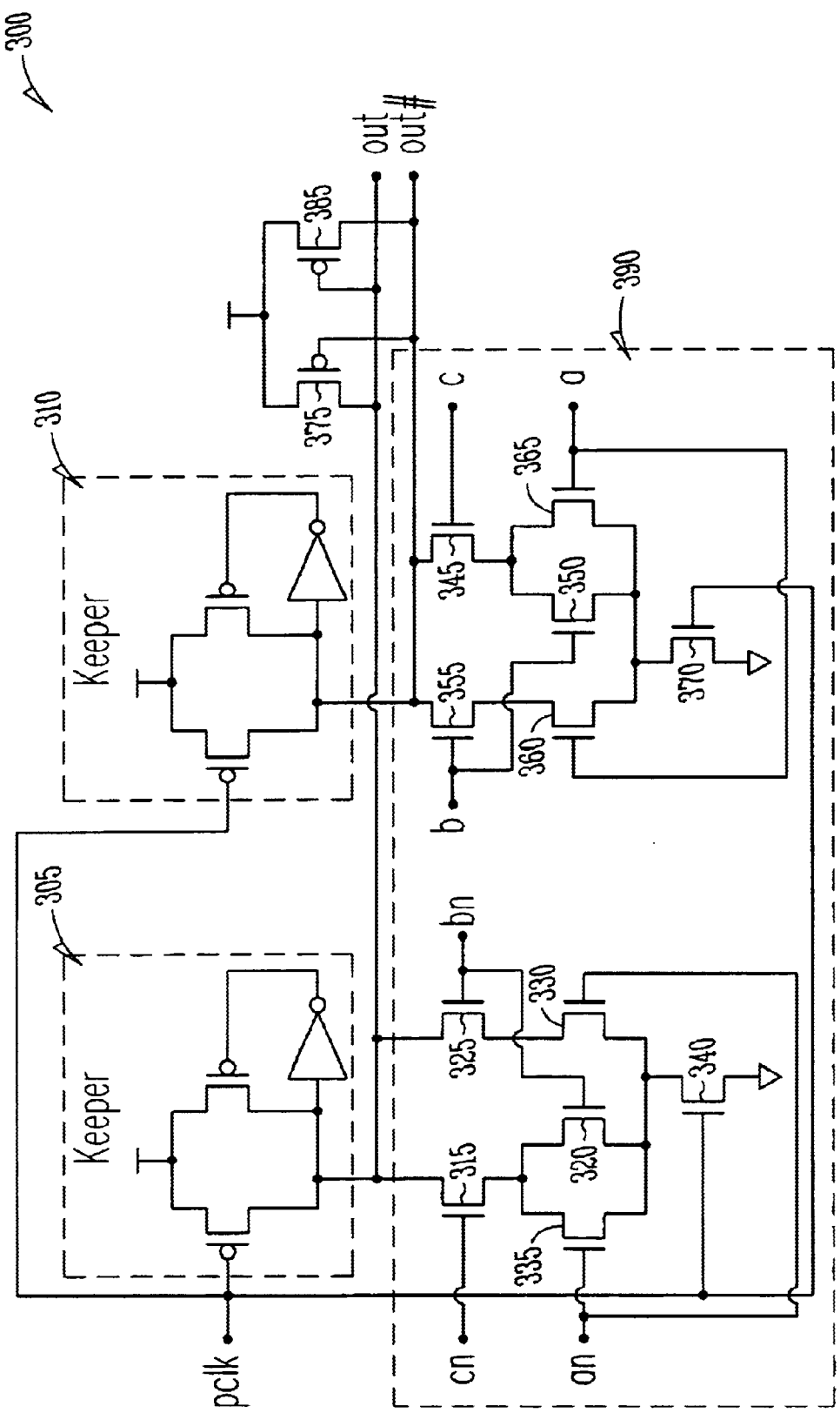
FIG. 3 is a schematic diagram illustrating an embodiment of a differential domino (dynamic) circuit.

FIG. 3 is schematic diagram of a differential domino circuit, which may be used to illustrate additional concerns in this regard. As is well-known to those of skill in the art, domino circuits are typically used in high performance circuit embodiments, such as various types of processors, for example. Such domino circuits typically operate in a cascade fashion. That is, one stage of circuitry typically triggers the next stage, or "dominoes" into the next stage. The operation of such circuits is well-known to those of skill in the art. Such domino circuits typically have pre-charge and evaluate phases, in a similar fashion as was previously discussed. However, because such circuitry typically employs a pulse clock, such results may be available for a relatively short period of time. Such pulse clocks, when employed in dynamic and/or differential circuitry, present pulse width concerns that are discussed hereafter.

The embodiment, 300, illustrated in FIG. 3 shows one technique that, at least in part, addresses the foregoing concern of retaining evaluate results in a differential domino circuit. In this regard, transistors 375 and 385 may function as a differential latch to retain such a result. However, such a result would be present until the differential domino circuit began its next pre-charge operation, which is typically a shorter duration than is desired in certain situations. In this respect, the differential output terminals, designated "out" and "out#" may be pre-charged high via keepers 305 and 310 when a clock signal applied via the terminal designated "pclk" is pulled low. Input signals may then be applied to transistors 315–335 and 345–365 in block 390. These transistors represent a logic function to be evaluated for this particular embodiment of a differential domino circuit. A pulse clock may then be asserted on the pclk terminal. This will turn on transistors 340 and 370, which will "evaluate" the logic function and the differential result will be "latched" by transistors 375 and 380. As those of skill in the art would know, in differential domino circuits, such as 300, one of the two differential output terminals would be pulled low as result of such an evaluate while the other remains high.

Although, the result will be "latched" in such an embodiment, that result will typically no longer be available once the next pre-charge operation begins, that is, when the pclk terminal is pulled low after the pulse clock duration. In situations where it may be desirable to retain the result of such an evaluate operation for a longer duration, such as until the next evaluate operation, a latch comprising cross-coupled NAND gates, such as was previously discussed, would typically be employed. However, employing such a latch may result in the previously discussed corresponding disadvantages.

As was previously indicated, the use of pulse clocks in differential circuits, such as the previously discussed embodiments, presents concerns associated with the width of such a pulse. Typically, reductions in such pulse widths may, in turn, result in performance improvements. In this regard, assuming a fixed time for a pre-charge operation, a shorter pulse clock duration may result in improved performance as more pulses may be generated over a given time period. As those of skill in the art would be aware, shortening such a pulse clock's duration may result in adverse effects due to what is typically referred to as signal evaporation. In this context, signal evaporation may be due, at least in part, to the intrinsic delay of transistors or logic gates associated with such a pulse clock. At a high level, if the pulse clock duration is not as long or longer than such associated intrinsic delays, signals in a circuit path may evaporate or disappear as evaluate results are not available for a sufficient period of time. This phenomenon is typically addressed by what may be referred to as a pulse width to gate delay ratio and is well-known to those of skill in the art. Based on the foregoing concerns, alternative techniques for retaining evaluate results from differential and dynamic circuitry may be desirable.

Figure 4:
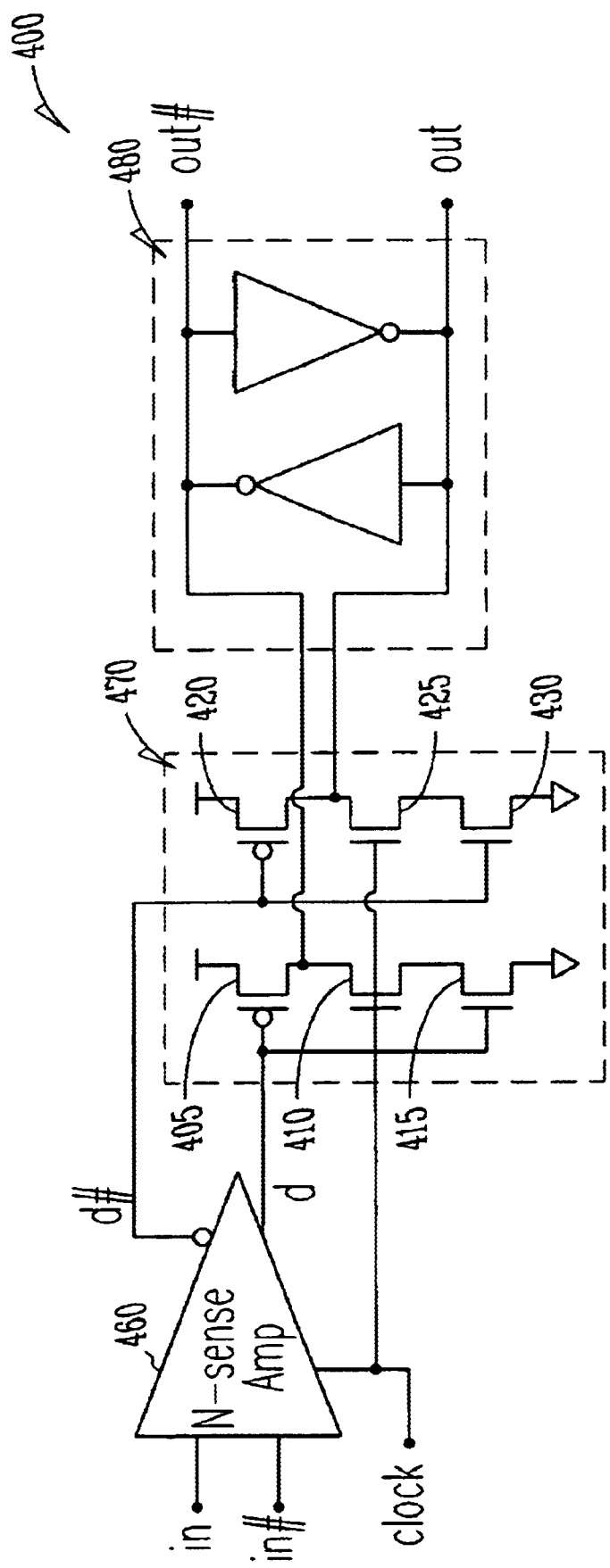
FIG. 4 is a schematic diagram illustrating an embodiment of an N-type sense latch in accordance with the invention.

FIG. 4 illustrates an embodiment of a differential sense latch in accordance with the invention that may address at least some of the foregoing concerns. While the invention is not limited in scope in this respect, this particular embodiment of a differential sense latch may be employed with an n-sense amp, as is illustrated in FIG. 4. This particular embodiment comprises n-sense amp 460, differential sense circuit 470 and latch, or jam latch, 480. Both n-sense amps and jam latches are well-known to those of skill in the art.

As was previously indicated, such a sense amp's output terminals would be pre-charged high while a signal asserted on the terminal that is designated "clock" is low. In this particular embodiment, during pre-charge, transistors 405, 410, 420 and 425 would be off. This would allow jam latch 480 to maintain a currently stored value as differential sense circuit would not be applying any voltage to the latch via the couplings illustrated in FIG. 4. Transistors 415 and 430 would be on, but would not affect the latch contents, as they would be electrically isolated from the latch by transistors 410 and 425. Once the output terminals are pre-charged, differential input signals may then be applied on the input terminals, designated "in" and "in#." For the sake of illustration, though the invention is not so limited, it will be assumed that terminal "in" is at a voltage greater than terminal "in#." After applying these input signals, generating a pulse clock on "clock" would result in these input signals being "evaluated." This evaluate operation would, in turn, result in "d#", the inverted output terminal of n-sense amp 460, being pulled low. The pulse clock would also turn on transistors 410 and 425, allowing the differential sense circuit to be evaluated in a dynamic fashion. Since "d", the non-inverted output terminal of n-sense amp 460 would remain high, transistor 405 would remain off and 415 would remain on. Since "d#", the inverted output terminal, is pulled low, transistor 420 would turn on and transistor 430 would turn off. In this situation, the terminal of jam latch 480 designated "out#" would be pulled low while the terminal designated "out" would be pulled high. This may be referred to as a push-pull configuration and would typically result in the contents of such a latch becoming stable faster than if one terminal of the latch was pulled high or low to change its contents, for example.

Such an embodiment may be advantageous over current embodiments in a number of respects. For example, the time employed to latch an evaluate result using such a configuration may be reduced relative to cross-coupled NAND gates, for example. This is due, at least in part, to two factors, though, of course, the invention is not limited in scope in this respect. First, as was previously indicated, the time employed to latch such a result in a cross-coupled NAND latch comprises two CMOS gate delays. In contrast, the time employed for this particular embodiment comprises a single simple gate delay. In this context, a simple gate delay means that transistor 420 may pull the terminal of latch 480, designated "out", high without any significant pull-down contention and, therefore, may be faster than a single CMOS gate delay. In such an embodiment, to reduce such pull-down contention, a pulse clock signal would be generated once transistor 425 was off, or "d#" was pulled low. There are number of techniques that may be employed to achieve such a result and the invention is not limited in scope to any particular technique for reducing pull-down contention. Second, such a configuration may employ less time to latch a result due, at least in part, to the previously discussed push-pull configuration. Because one terminal of latch 480 would be pulled high and one terminal pulled low at substantially the same time, the time to "latch" a result may be reduced as compared to the two CMOS gate delays typically employed by prior embodiments. An additional benefit of this particular embodiment is due, at least in part, to the aspect that such embodiments latch evaluate results based, at least in part, on a clock signal. Therefore, such a differential sense amp may alternatively be employed as a flip-flop, which may provided additional design flexibility in certain embodiments.

As was previously discussed with respect to prior embodiment latches, this particular embodiment may also address concerns related to signal evaporation. Because such differential sense latches operate in a substantially static manner they may have higher gain than conventional latch circuits. Therefore, such differential sense latches may refresh signals to a voltage substantially equivalent to the power supply voltage for circuits in which they are employed. Therefore, the adverse affects of evaporation may be reduced. Additionally, this particular embodiment may employ less silicon area and consume less power than prior embodiments for a variety of reasons. For example, due at least in part to the differential sense circuit being operated with reduced pull-up and pull-down contention, the transistors employed may be smaller, as less drive current may be employed to achieve similar performance, or even improved performance. Also, this lack of contention may reduce the amount of power consumption as switching current may be reduced. Additionally, due at least in part to the fact that such embodiments are not configured in a cross-coupled configuration, reductions in transistor sizes may also be realized, as output terminal loading and gate-delays may be reduced. Therefore, embodiments such as 400 may consume less power and silicon area than prior embodiments without an adverse effect or with a reduced adverse effect, and perhaps a potential improvement in performance.

Another potential advantage of embodiments, such as 400, as compared to other typical differential or dynamic circuit elements is based, at least in part, on the aspect that they operate in a substantially static manner and that they may be evaluated in a dynamic fashion. These aspects of such embodiments may allow them to be employed to interface with static logic, such as CMOS gates, differential circuitry, such as sense amps, and dynamic circuitry, such as domino or differential domino circuits. This flexibility may result in design and performance benefits, such as those that have been previously discussed. The invention is, of course, not limited in scope to the foregoing advantages or applications, and additional benefits and techniques may exist in alternative embodiments.

Figure 5:
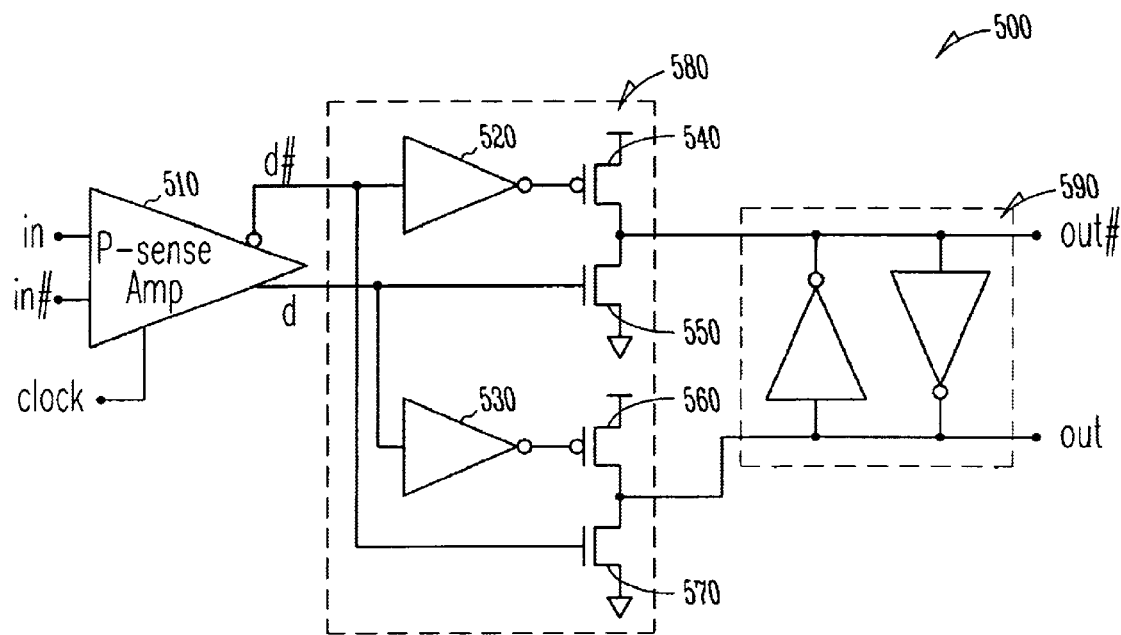
FIG. 5 is a schematic diagram illustrating an embodiment of a P-type sense latch in accordance with the invention.

FIG. 5 illustrates an alternative embodiment of a differential sense latch, which may be employed with differential circuitry, for example. For this particular embodiment, the differential sense latch comprises differential sense circuit 580 and jam latch 590. As is illustrated in FIG. 5, such a differential sense latch may be employed, for example, with a p-sense amp, though the invention is not limited in scope in this respect. Alternatively, such a latch might be employed with a differential p-type domino circuit, for example.

As was previously indicated, p-sense amp outputs typically are pulled low during pre-charge. For this particular embodiment, during such a pre-charge operation, transistors 540, 550, 560 and 570 would be off and, therefore, the output terminals of differential sense circuit 580 would not be driven by the differential sense circuit, or tri-stated as it is typically called. For this embodiment, since the clock input signal is inverted, pre-charge would occur when a signal applied to "clock" is pulled low, in a similar manner as discussed with respect to FIG. 4. This may be advantageous as p-sense amps and n-sense amps employed in the same circuit would pre-charge and evaluate substantially simultaneously and, therefore, facilitate synchronous or sequential operation of such circuits.

For this particular embodiment, jam latch 590 would retain a previously stored result during such a pre-charge operation, as may be desired. As is illustrated in FIG. 5, differential sense circuit 580 is not coupled with the "clock"

terminal. This may be advantageous, as the differential sense circuit would not add additional load to a clock distribution tree in such embodiments, which may, in turn, reduce area and power consumption over alternative techniques that might be employed.

Again, for illustrative purposes, it will be assumed that a signal applied to the terminal designated "in" is of a voltage greater than a signal applied to the terminal designated "in#." P-sense amp 510 would "evaluate" these input signals in response to, for example, a pulse clock signal on the terminal designated "clock" in FIG. 5. For this particular example, the non-inverted output terminal, designated "d", of p-sense amp 510 may be pulled high as a result of such pulse clock signal. This, in turn, would result in turning on transistors 540 and 560, which would, respectively, pull the terminal of jam latch 590, designated "out#", low and the terminal designated "out" high. For this particular embodiment, two parallel gate delays are present. The terminal of jam latch 590 being pulled down will be on a signal path with a simple gate delay, as was previously discussed. The terminal of jam latch 590 being pulled up will be on a circuit path with a full gate delay, due to either inverter 520 or 530, plus a simple gate delay, due to either transistor 540 or 560. While this configuration may have additional gate delay as compared to the embodiment illustrated in FIG. 4., it may provide performance advantages over prior embodiments that comprise two full CMOS gate delays. These performance advantages would be due, at least in part, to a reduction in gate delay. Additionally, performance advantages may result due, at least in part, to the reduction of pull-up/pull-down contention and the push-pull configuration of jam latch 590, as was previously described.

Figure 6:
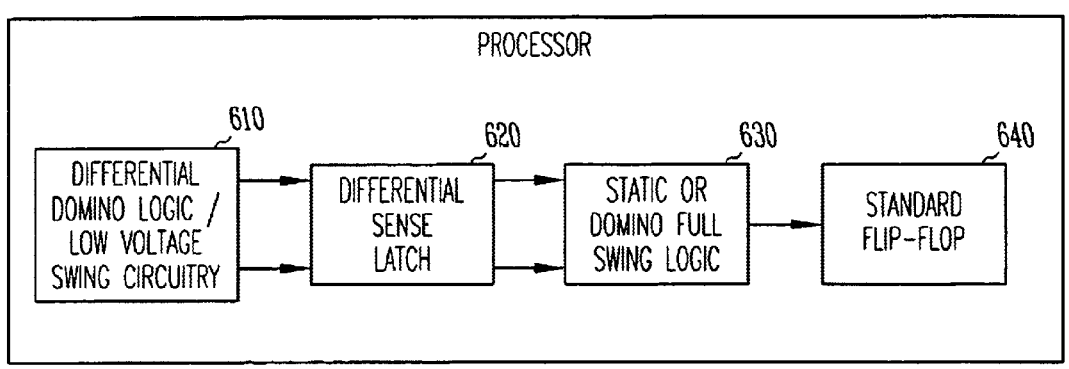
FIG. 6 is a block diagram illustrating an embodiment of a processor in accordance with the invention.

FIG. 6 illustrates a block diagram of an IC in accordance with the invention. This particular embodiment comprises a processor, which may comprise a microprocessor, digital signal processor or network processor, for example. For this particular embodiment, a differential sense latch, 620, such as those previously discussed, may be employed in a datapath of such a processor. As is well-known to those of skill in the art, a datapath, in this context, may comprise a circuit path employed for performing, for example, calculations or electronic operations in such a processor. Here, though the invention is not limited in scope in this respect, such a differential sense latch may be coupled to either a differential domino circuit or low voltage swing circuitry, such as a sense amp, for example, as illustrated in block 610. Differential sense latch 620 is further coupled to either static or domino full swing logic in block 630, which is, in turn, coupled to additional logic, such as flip-flop 640 for this particular embodiment. The invention is, of course, not limited in scope to use in datapaths, ICs or processors and many alternative applications may exist.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A circuit comprising;

a differential sense circuit;

a latch, said latch comprising cross coupled inverters;

said differential sense circuit and said latch being coupled so as to form a differential sense latch such that, in operation, an electronic signal stored in said latch is retained for at least one clock cycle;

further comprising a sense amp, said sense amp and said differential sense latch coupled such that, in operation, differential signals present on differential output terminals of said sense amp cause an electronic signal to be stored in said differential sense latch;

wherein said sense amp comprises an n-type sense amp;

wherein said differential sense circuit comprises:

a first inverter and a second inverter each having stacked n-devices, an input terminal, an output terminal and a clock terminal;

said output terminal of said first inverter and said output terminal of said second inverter being coupled, respectively, to opposite terminals of said latch, said input terminals being coupled, respectively, to a non-inverted output terminal and an inverted output terminal of said n-type sense amp; and said clock terminals being coupled to a pre-charge clock terminal of said n-type sense amp, wherein said clock terminals of said first and second inverters are further coupled to a respective top n-device of said stacked n-devices in said first and second inverters.

2. The circuit of claim 1, wherein said inverters comprise transistors which, in operation, represent substantially equivalent loads to said inverted and non-inverted output terminals of said n-type sense amp.

\* \* \* \* \*